United States Patent
LeBeau

[11] Patent Number: 6,128,404
[45] Date of Patent: Oct. 3, 2000

[54] METHOD OF DETECTING DEFECTS IN SEMICONDUCTOR PACKAGE LEADS

[75] Inventor: Christopher J. LeBeau, Tempe, Ariz.

[73] Assignee: Motorola, Inc., Schaumburg, Ill.

[21] Appl. No.: 08/340,946

[22] Filed: Nov. 17, 1994

Related U.S. Application Data

[62] Division of application No. 08/100,829, Aug. 2, 1993, Pat. No. 5,452,368.

[51] Int. Cl.[7] .................................................. G06K 9/00
[52] U.S. Cl. ........................................................ 382/149
[58] Field of Search .................................. 382/141, 144, 382/145, 218, 221, 100, 149, 151, 147; 348/126, 129; 356/237

[56] References Cited

U.S. PATENT DOCUMENTS

| | | | |
|---|---|---|---|
| 4,641,256 | 2/1987 | Marchegiano et al. | 702/57 |
| 4,853,968 | 8/1989 | Berkin | 382/151 |
| 4,860,371 | 8/1989 | Matsuyama et al. | 382/149 |
| 5,060,281 | 10/1991 | Ohnishi | 382/112 |
| 5,091,963 | 2/1992 | Litt et al. | 382/149 |
| 5,513,275 | 4/1996 | Khalaj et al. | 382/149 |
| 5,608,818 | 3/1997 | Chini et al. | 382/153 |
| 5,649,022 | 7/1997 | Maeda et al. | 382/141 |
| 5,734,742 | 3/1998 | Asaeda et al. | 382/141 |

OTHER PUBLICATIONS

Gonzales et al, "Digital Image Processing," 1992, pp. 100–111, pp. 47–48.

*Primary Examiner*—Joseph Mancuso
*Attorney, Agent, or Firm*—Anthony M. Martinez

[57] ABSTRACT

A method of detecting defects (14, 16, 17, 44, 47, 49, and 51) in objects is presented. A first grey level image (18) of a first object (10) is formed and a second grey level image (19) of a second object (12) is formed. The first (18) and second (19) grey level images are converted to a first (21) and a second (22) edge feature image, respectively. The first edge feature image is dilated (26) and the second edge feature image is skeletonized (27). The dilated (26) and skeletonized images (27) are compared. An alternate method includes forming a grey level image (40) of an object. A principal axis of the grey level image is identified, and a shifted grey level image is formed by shifting the grey level image a distance along the principal axis. The grey level image (40) is then compared to the shifted grey level image.

4 Claims, 3 Drawing Sheets

METHOD OF DETECTING DEFECTS IN SEMICONDUCTOR PACKAGE LEADS

This is a division of application Ser. No. 08/100,829, filed Aug. 2, 1993 now U.S. Pat. No. 5,452,368.

BACKGROUND OF THE INVENTION

The present invention relates, in general, to image processing, and more particularly, to detecting defects in objects using a novel image processing method.

In the past, a variety of image processing or pattern recognition techniques have been used to detect defects in objects such as semiconductor devices. These prior defect detection methods typically involve comparing an image of an object to be tested to an image of a defect-free object or other known reference pattern. One problem with these prior techniques is registration. The prior methods typically require exact registration between images of the object to be tested and the reference pattern. Often, a digitized image of an object to be tested has variations in feature widths and locations due to the digitizing-algorithms, magnification differences, physical orientation of the objects, and variations in the physical size of the objects. Because of the variations, defect-free shapes can be interpreted as a defect.

An additional problem is the resolution that can be achieved. Because of the variations, the grey level images typically could not be used to accurately locate defects that were near the edges of defect-free features of the object. Consequently, objects may have defects that are not detected by these prior methods.

Accordingly, it is desirable to have a method of detecting defects that does not compare grey level images of different objects, that does not interpret grey level image variations as a defect, and that does not interpret variations as a defect.

SUMMARY OF THE INVENTION

Briefly stated, the present invention includes a method of detecting defects. A first grey level image of a first object is formed and a second grey level image of a second object is formed. The first and second grey level images are converted to a first and a second edge feature image, respectively. The first edge feature image is dilated and the second edge feature image is skeletonized. The dilated and skeletonized images are compared. An alternate method includes forming a grey level image of an object. A principal axis of the grey level image is-identified, and a shifted grey level image is formed by shifting the grey level image a distance along the principal axis. The grey level image is then compared to the shifted grey level image.

DETAILED DESCRIPTION OF THE DRAWINGS

Figure 1:
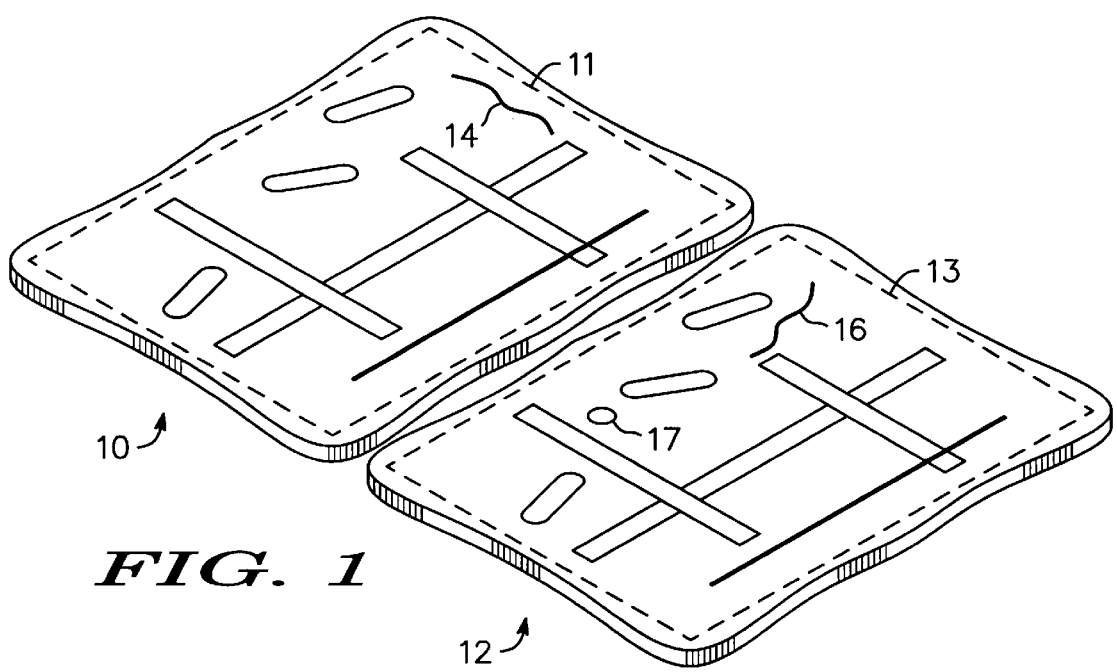
FIG. 1 illustrates a perspective cut-away view of objects having defects in accordance with the present invention.

FIG. 1 illustrates a perspective cut-away view of a first object 10 and a second object 12 that are to be inspected for defects. Objects 10 and 12 can be a variety of different types of items including individual semiconductor devices, semiconductor devices on a single or different semiconductor wafer, printed circuit boards, semiconductor packages, semiconductor package leadframes, and semiconductor Tape Automated Bonding (TAB) leadframes. A variety of elements having different shapes are on the surface of objects 10 and 11 as illustrated by the shapes of elements within a dashed box 11 and a dashed box 13, respectively. The elements could be conductive lines or metal traces on a semiconductor package or semiconductor device, or leads of a semiconductor leadframe or package. Also within box 11 is a defect 14 representing defects such as a foreign matter on the surface of object 10, a crack in the surface of object 10, stains on object 10, or an irregular grain structure. Within dashed box 13 are similar defects 16 and 17 on object 12.

Figure 2:
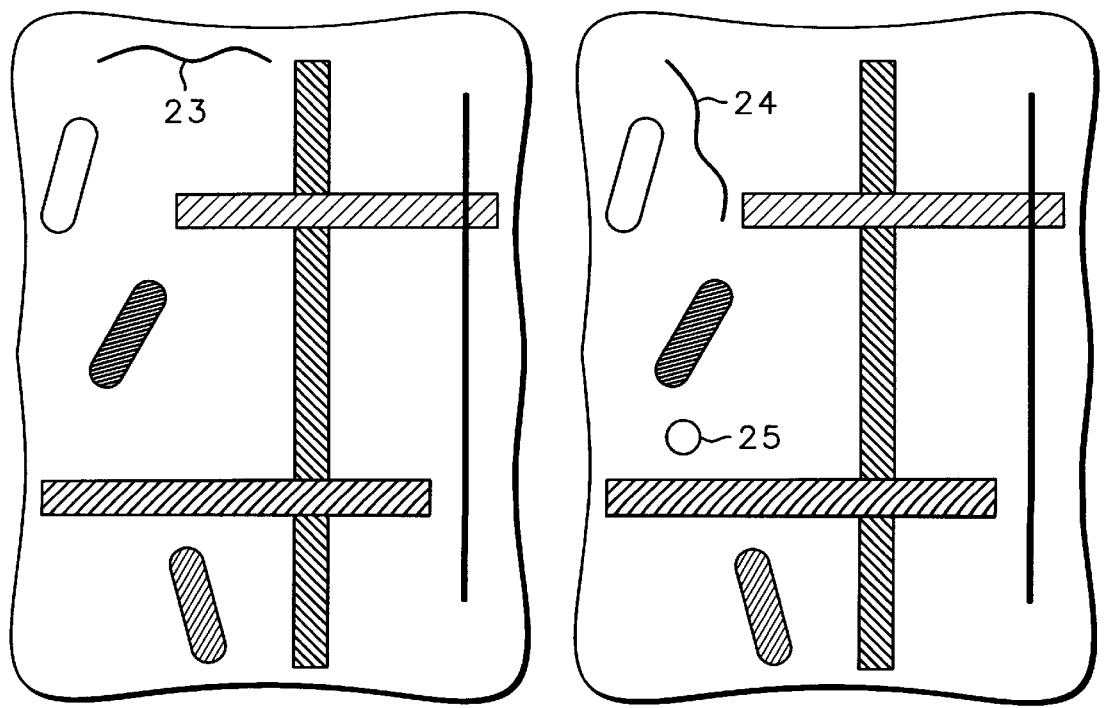
FIG. 2 illustrates enlarged grey scale images of the objects of FIG. 1 in accordance with the present invention.

Referring to FIG. 2, enlarged grey scale images 18 and 19 illustrate images of the elements within dashed boxes 11 and 13 respectively of FIG. 1. Images 18 and 19 are acquired and displayed by a digital computer (not shown) utilizing digital image processing and acquisition techniques that are well known to those skilled in the art. Examples of acquiring and displaying images are described in U.S. Pat. No. 5,204,910 issued to Christopher Lebeau on Apr. 20, 1993, in U.S. Pat. No. 4,589,140 issued to Bishop et al on May 13, 1986, and in the article "Tutorial On Advances In Morphological Image Processing And Analysis", Petros Maragos, Optical Engineering, Vol. 26, No. 7, Jul. 1986, pp. 623–632 all of which are hereby incorporated herein by reference. Typically, images 18 and 19 are enlarged by a factor between approximately 10 and 100 times larger than the elements on objects 10 and 12 of FIG. 1. Acquired image defects 23, 24, and 25 represent the acquired grey scale image of defects 14, 16, and 17, respectively, that are illustrated in FIG. 1. Since defects 23, 24, and 25 are grey scale representations of defects 14, 16, and 17, defects 23, 24, and 25 have different reference numbers. In subsequent FIGS. 3, 4, and 5, different reference numbers will also be used since different representations of defects 14, 16, and 17 are shown.

Figure 3:
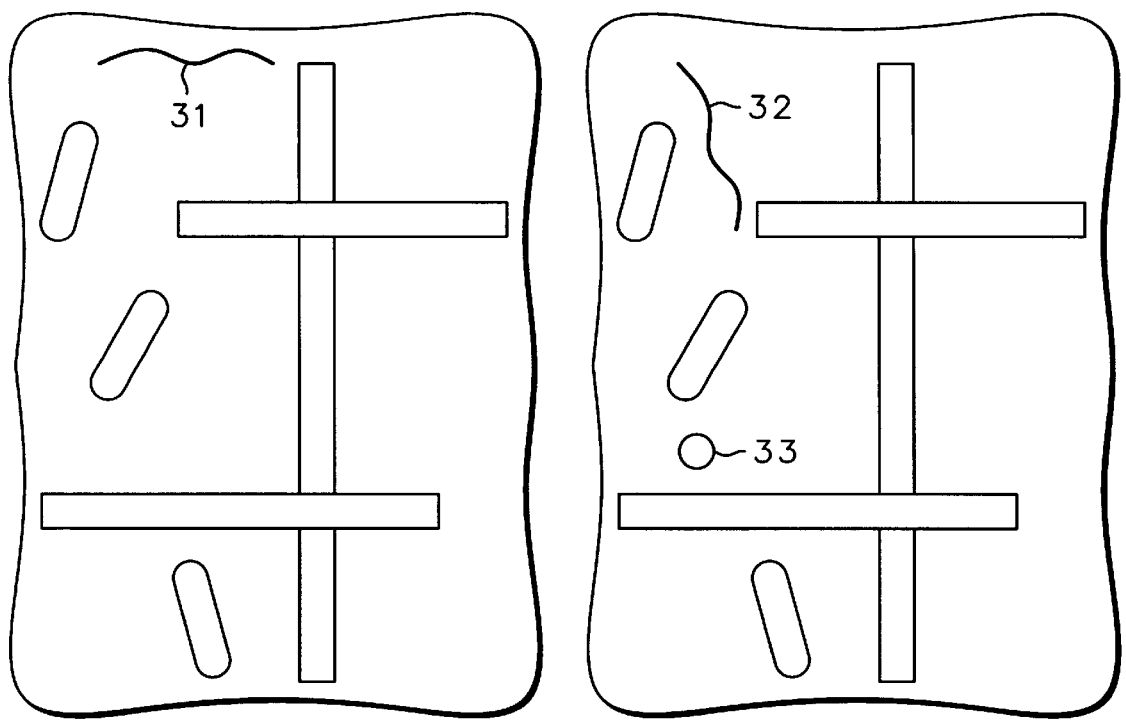
FIG. 3 illustrates edge feature images of the grey scale images o f FIG. 2 in accordance with the present invention.

Referring to FIG. 3, after images 18 and 19 (FIG. 2) are acquired, images 18 and 19 are converted to first edge feature image 21 and second edge feature image 22, respectively. Defect edge images 31, 32, and 33 represent the edge feature images of acquired grey scale image defects 23, 24, and 25 (FIG. 2), respectively. In order to form edge feature images 21 and 22, images 18 and 19 (FIG. 2) typically are scanned in four different directions, top-to-bottom, right-to-left, bottom-to-top, and left-to-right, thereby creating four edge feature images of each image 18 and 19. The edge features resulting from each of the four scans can vary slightly because of differences in lighting on each individual edge and because of reflections from each edge. Techniques for forming edge feature images are well known in the art. An example of forming edge feature images is described in "Digital Image Processing", Rafael Gonzalez et al, Addison-Wesley, 1987, pp. 334–340. In some instances, the four edge feature images are combined to provide one composite edge feature image. In such a case, subsequent operations are performed on the composite image. In the preferred embodiment, four separate edge feature images are created for each image 18 and 19 (FIG. 2). In this preferred embodiment, images 21 and 22 each represent one edge feature image that is derived from one scan of each object 10 and 12 respectively. Also in this preferred embodiment, quantization errors in the process of forming digital grey level images 18 and 19 of FIG. 2 typically cause the edges of images of 21 and 22 to be approximately five to ten pixels wide.

Figure 4:
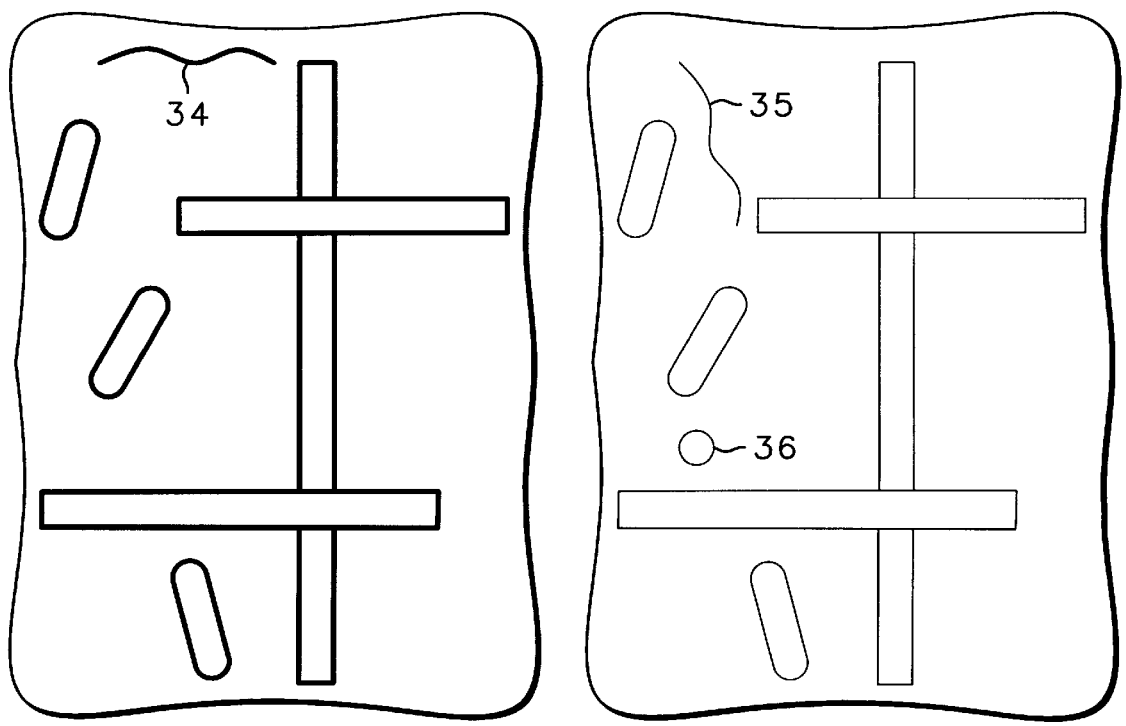
FIG. 4 illustrates dilated and skeletonized images of the edge feature images of FIG. 3 in accordance with the present invention.

Referring to FIG. 4, the width of each edge of each element of image 21 (FIG. 3) is dilated or increased in order to create a first dilated image 26. Image 22 (FIG. 3) is skeletonized by reducing the width of the edges of each element to produce a first skeletonized image 27. One example of dilating and skeletonizing images is provided in "Handbook of Pattern Recognition and Image Processing", Ed. Tzay Young et al, Academic Press, San Diego, 1986, pp. 262–264. In the preferred embodiment, skeletonizing is accomplished by retaining only the center pixel of each edge of image 22 (FIG. 3). Also in the preferred embodiment, dilation is performed by increasing each edge of each image 21 by an amount between ten and fifty percent. A dilated defect 34 represents the dilated image of defect 31 (FIG. 3), and skeletonized defects 35 and 36 represent the skeletonized image of defects 32 and 33 (FIG. 3), respectively. After skeletonizing and dilating are complete, image 27 is compared to image 26, and all skeletonized edges in image 27 that are not contained within the dilated edges of image 26 are retained as defects. As described hereinafter in the description of FIG. 7, the comparison may be either a binary operation using an inversion of one image followed by a logical "and" operation or the comparison may be a grey scale subtraction. Often, defects below a certain size are not considered detrimental. In such a case, shapes can be sorted by size to prevent detecting defects below a size that is not a problem for a particular application.

As illustrated in FIG. 4, defects 35 and 36 are not contained within any of the dilated edges of image 26, and are identified as defects by this procedure. In the preferred embodiment, the comparison and defect identification operation is repeated four times, once for each set of edge feature images that are derived by scanning images 18 and 19 (FIG. 2) in the four different directions as discussed hereinbefore in the description of FIG. 2. Any defect found in any of the four different sets of images indicates a defect in either object 10 or 12 (FIG. 1). Since neither object 10 or 12 (FIG. 2) is a known good object, the defect could be a missing portion of object 10 or an addition to object 12.

Figure 5:
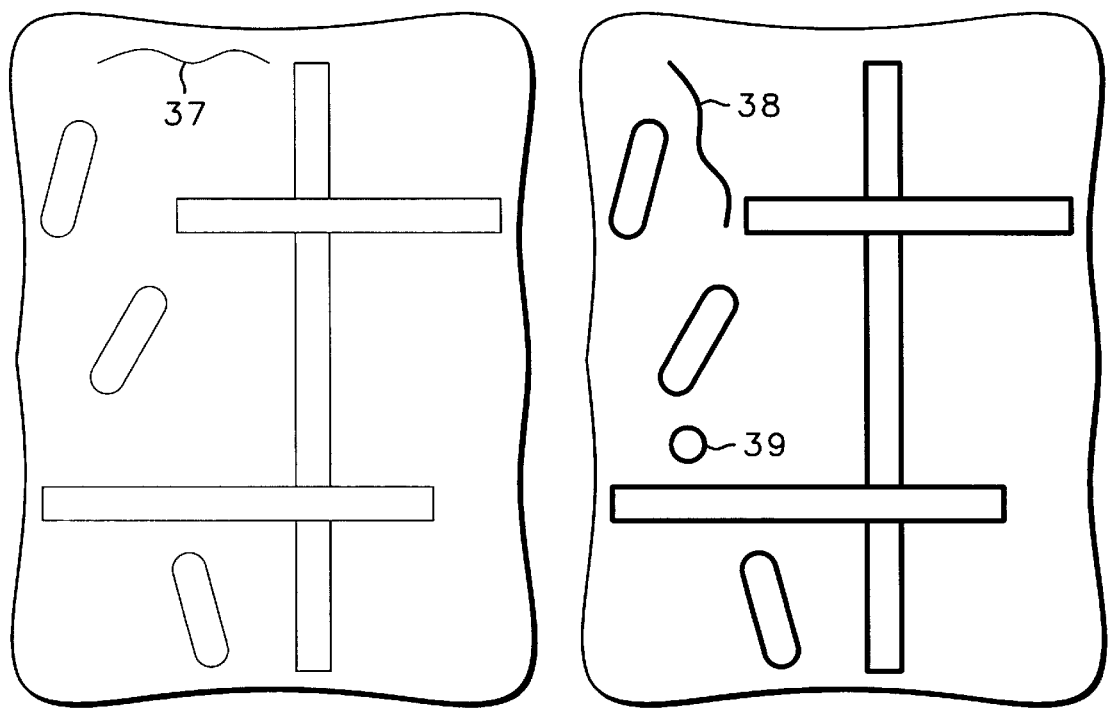
FIG. 5 illustrates skeletonized and dilated images of the edge feature images of FIG. 3 in accordance with the present invention.

Referring to FIG. 5, the dilating and skeletonizing operations in the description of FIG. 4 are reversed. Image 21 (FIG. 3) is skeletonized to form a second skeletonized image 28 having a skeletonized defect 37, and image 22 (FIG. 3) is dilated to form a second dilated image 29 having dilated defects 38 and 39. Image 28 is then compared to image 29 to find edges within image 28 that are not contained within the dilated edges of image 29. As illustrated in FIG. 5, defect 37 would not be contained within any of the dilated edges of image 29 and is identified by the comparison as a defect. In the preferred embodiment, the dilation, skeletonization, and comparison is done for each of the four edge feature images derived from images 18 and 19 as discussed in the description of FIG. 2. Any defect found in any of the four sets of images represents a defect as described hereinbefore in the description of FIG. 4.

The technique of comparing edge feature images of two similar objects facilitates finding, among other things, defects in two semiconductor die on a single semiconductor wafer, or defects in two adjacent lead frames on a lead frame strip. By using adjacent die on the wafer, variations in shading and feature sizes that occur across an entire wafer are not erroneously detected as a defect because such variations are minor between adjacent die as opposed to die on opposite sides of the wafer.

Figure 6:
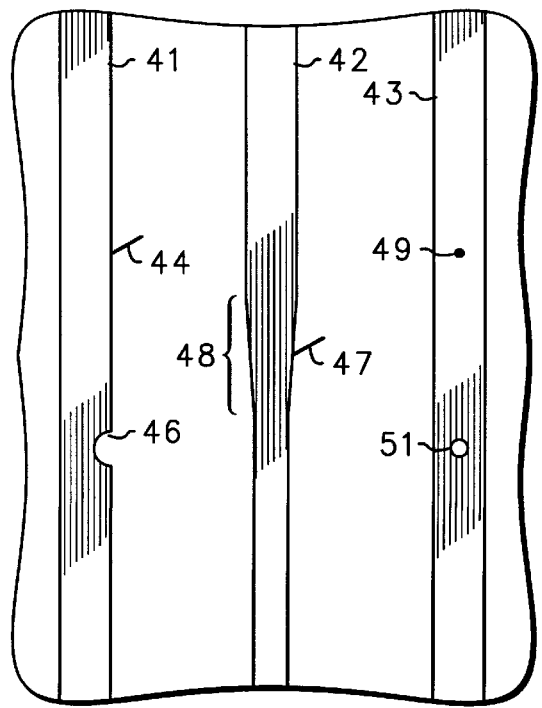
FIG. 6 illustrates an enlarged grey scale image of an object in accordance with an alternate embodiment of the present invention.
Figure 7:
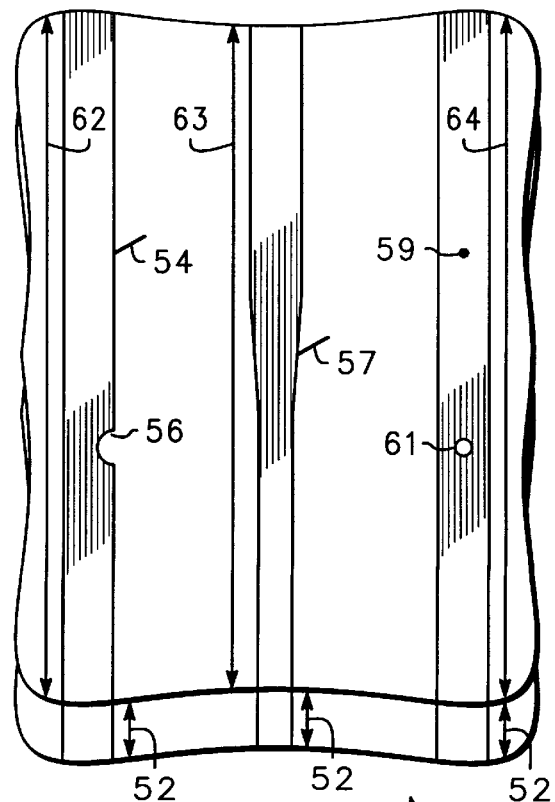
FIG. 7 illustrates a shifted grey scale image in accordance with the alternate embodiment of the present invention.

FIGS. 6 and 7 illustrate an alternate method of detecting defects. The alternate method generally is applicable to objects having straight lines. If the object contains angles, the object is broken into multiple sections of straight lines, and each section is analyzed separately. Such objects include, but are not limited to, metal conductors on a semiconductor device, leads of a semiconductor package, and metal traces on printed circuit boards.

FIG. 6 represents an enlarged grey scale image 40 of a portion of an object. Image 40 is acquired by using acquisition techniques described in the description of FIG. 2. Image 40 includes element images 41, 42, and 43 that represent elements on the object from which image 40 is captured. Element images 41, 42, and 43 could represent, among other things, portions of metal conductors on a printed circuit board, conductors on a semiconductor package, conductors on a semiconductor device, or leads of a semiconductor package. Image 41 includes images of two defects illustrated by a burr or whisker defect 44, and a missing portion defect 46. Image 42 has an image of a defect illustrated as a burr or whisker defect 47 that is located along a transition section 48 that connects two varying width sections of image 42. Image 43 includes images of two defects represented by a foreign matter defect 49 and a through hole defect 51. Defects 44, 46, 47, 49, and 51 are shown to illustrate different types of defects and are not limitations of the type of defects that can be identified.

Referring to FIG. 7, a comparison image 45 is formed by duplicating image 40 (FIG. 6) and shifting the duplicate image a distance 52 along a major axis of images 41, 42, and 43. This forms a shifted image that includes shifted element images 62, 63, and 64 that represent images 41, 42, and 43 as shifted by distance 52. As shown in FIG. 7, image.40 (FIG. 6) is overlaid with the shifted image to illustrate distance 52. Defects 44, 46, 47, 49, and 51 shown in FIG. 6 are represented by shifted defects 54, 56, 57, 59, and 61 respectively. After shifting, images 62, 63, and 64 are compared to images 41, 42, and 43 in order to identify the defects. One method of performing the comparison is to subtract the grey scale representation of images 41, 42, and 43 from the grey scale representation of images 62, 63, and 64. The result is a composite grey scale representation of the images. The composite grey scale representation may include negative numbers representing holes in the minuend image or whiskers on the subtrahend image.

In the preferred embodiment, the grey scale representation of images 41, 42, 43, and the grey scale representation of images 62, 63, and 64 are converted to binary representations. The binary representation of one set of images is inverted, and a logical "and" function is performed using the inverted and non-inverted binary representations. The logical operation provides a logical one or positive representation-for positive defects in the non-inverted image, and also for negative defects in the inverted image. Thus, the method identifies both missing areas or portions of elements as well as foreign matter and other additive type defects. The binary representation is utilized to reduce processing time and increase throughput.

For example, images 41, 42, 43, 62, 63, and 64 are converted to binary, and the binary representation of images 62, 63, and 64 is inverted. Then, a logical "and" function is performed on the binary representation of images 41, 42, and 43 and the inverted binary representation of images 62, 63, and 64. Defect 56 becomes a logical one and the surrounding portions of image 62 become logical zero. The corresponding defect 46 in image 41 is a logical zero and the surrounding portions of image 41 are logical one. The "and" function "and"s the logical one of defect 56 with the surrounding logical one portion of image 41 thereby providing a logical one representation of defect 56. Since the surrounding portion of image 62 is a logical zero, the logical "and" results in a logical zero in all other portion of image 62 and defect 46 does not produce a logical one result. Thus, missing portion defect 46 on image 41 is detected by the inverted defect 56. Similarly, defect 44 produces a logical one result while defect 54 produces a logical zero result. Thus, defect 44 is detected.

In order to identify the defects, it is important that distance 52 be at least as large as the smallest defect that is to be detected. Such a distance ensures that the original and inverted defect images do not overlap thereby ensuring the defect is-detected.

For example a distance 52 of ten microns permits detecting defects that are less than or equal to ten microns. Also, if distance 52 is large compared to the length of section 48, portions of section 48 could be detected as a defect. Thus, distance 52 should be small compared to the length of section 48. Alternately, image 42 could be divided into multiple sections to alleviate this effect of section 48.

By now it should be appreciated that a novel method of detecting defects has been provided. Comparing edge feature images of two similar objects eliminates registration problems and erroneous defect detection caused by improper registration. Using edge feature images also permits detecting defects near the edges of each element. Also, the technique of comparing an image and a shifted image of the same element permits detecting defects near the element's edge, and facilitates detecting missing portions of the element.

What is claimed is:

1. A method of detecting a defect in an object comprising:

forming a grey scale image of the object wherein the grey scale image has a major axis;

forming a shifted image of the grey scale image by shifting the grey scale image along the major axis; and comparing the shifted image to the grey scale image to detect the defect.

2. The method of claim 1 wherein comparing the shifted image to the grey scale image includes forming a binary image of the grey scale image and a binary image of the shifted image, inverting the binary image of shifted image to form an inverted binary image, and performing a logical "and" function using the binary image of the grey scale image and the inverted binary image.

3. The method of claim 1 wherein shifting the grey level image includes shifting the grey level image a distance at least as large as a minimum size of the defect to be detected.

4. The method of claim 1 wherein the object is a metal conductor.

* * * * *